(12) United States Patent
Kim

(10) Patent No.: US 6,413,816 B2
(45) Date of Patent: Jul. 2, 2002

(54) METHOD FOR FORMING MEMORY CELL OF SEMICONDUCTOR MEMORY DEVICE

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/747,793

(22) Filed: Dec. 22, 2000

(30) Foreign Application Priority Data

Dec. 23, 1999 (KR) .............................. 99-61039

(51) Int. Cl.[7] ......................................... H01L 21/8242
(52) U.S. Cl. ....................................................... 438/253
(58) Field of Search ................................. 438/396, 253, 438/FOR 212

(56) References Cited

U.S. PATENT DOCUMENTS

| | | |
|---|---|---|
| 5,569,948 A | 10/1996 | Kim |
| 5,595,937 A | 1/1997 | Mikagi |
| 5,688,713 A * | 11/1997 | Linliu et al. |
| 6,001,685 A | 12/1999 | Kim |
| 6,072,221 A | 6/2000 | Hieda |
| 6,080,622 A | 6/2000 | Kang |
| 6,168,984 B1 * | 1/2001 | Yoo et al. |
| 6,177,307 B1 * | 1/2001 | Tu et al. |
| 6,255,151 B1 * | 7/2001 | Fukuda et al. |

* cited by examiner

Primary Examiner—George Fourson
Assistant Examiner—Joannie Adelle Garcia
(74) Attorney, Agent, or Firm—Timothy J. Keefer; Wildman, Harrold, Allen & Dixon

(57) ABSTRACT

A method for fabricating a semiconductor memory device. The method includes providing a semiconductor substrate where a transistor has been formed; forming a bit line electrically connected to a second contact plug on a drain region and forming a contact hole exposing a first contact plug on a source region; forming an etch barrier film having a uniform thickness at the inner walls of the contact hole and on the bit line; forming an interlayer insulation film; forming a storage electrode contact by etching the interlayer insulation film and the etch barrier film on the first contact plug; forming a third contact plug electrically connected to the first contact plug in the storage electrode contact; and forming on the third contact plug a capacitor having a stacked structure of a storage electrode, and a dielectric film and a plate electrode surrounding the storage electrode.

6 Claims, 19 Drawing Sheets

METHOD FOR FORMING MEMORY CELL OF SEMICONDUCTOR MEMORY DEVICE

CROSS REFERENCE TO RELATED APPLICATION

This application claims the priority of Korean patent application Serial No. 99-61039 filed on Dec. 23, 1999.

BACKGROUND OF THE INVENTION

1. Field of the Invention

The present invention relates to a method for fabricating a semiconductor memory device, and in particular to an improved method for fabricating a semiconductor memory device which can form a storage electrode contact and a contact plug according to a self aligned method.

2. Description of the Background Art

The high integration of a semiconductor memory device such as a DRAM and an SRAM is accompanied with a decrease of a cell area. Therefore, an occupied width of a capacitor on a substrate must be reduced. It is important to reduce the occupied width of the capacitor in fabricating a high capacity memory device. The occupied width of the capacitor must be reduced in consideration of stabilized capacitance.

As publicly known, the capacitance of the capacitor is proportional to a surface area of an electrode and a dielectric constant of a dielectric material, and inversely proportional to an interval between the electrodes, namely a thickness of the dielectric material. At this time, a method for decreasing the thickness of the dielectric material has a limit due to leakage current. Accordingly, the stabilized capacitance is obtained by increasing the surface area of the electrode. For example, a storage electrode having a three-dimensional structure such as a cylinder, a pin and a stack type obtains the stabilized capacitance of the capacitor by increasing its surface area.

FIG. 1 is a plan view illustrating masks used to form a memory cell of the semiconductor memory device. Reference numeral 102 denotes an active mask, 104 denotes a gate electrode mask, 106 denotes a contact plug mask, 108 denotes a bit line contact mask, 110 denotes a bit line mask, and 112 denotes a storage electrode contact mask.

A conventional method for fabricating a semiconductor memory device by using the aforementioned masks will now be described with reference to FIGS. 2A to 2D. Here, Figures at the left side are cross-sectional diagrams taken along line a-a' in FIG. 1, and Figures at the right side are cross-sectional diagrams taken along line b-b' in FIG. 1.

Referring to FIG. 2A, a device isolation film 202 is formed at a predetermined portion of a semiconductor substrate 200. A gate insulation film 204, a conductive film for a gate electrode and a first hard mask film 208 are sequentially formed on the semiconductor substrate 200. The first hard mask film 208 and the conductive film for the gate electrode are patterned according to an etching process using the gate electrode mask 104 as shown in FIG. 1, thereby forming a gate electrode 206. Source/drain regions 210, 212 are formed on the exposed semiconductor substrate 200 according to an impurity ion implantation process. A first etch barrier film 214 is formed over the resultant structure. A first interlayer insulation film 216 is evenly formed on the first etch barrier film 214.

The first interlayer insulation film 216 is etched by employing as an etch barrier the contact plug mask 106 as shown in FIG. 1 and the first etch barrier film 214, and then the first etch barrier film 214 is partially removed, thereby forming a contact hole exposing the source region 210 to be connected to a capacitor and the drain region 212 to be connected to a bit line. The contact hole is filled with a conductive film. Thereafter, the conductive film is etched back to expose the first interlayer insulation film 216, thereby forming first and second contact plugs 218a, 218b.

Referring to FIG. 2B, a second interlayer insulation film 220 is formed on the semiconductor substrate 200 where the first and second contact plugs 218a, 218b have been formed. The second interlayer insulation film 220 is etched to expose the second contact plug 218b on the drain region, by performing an etching process using the bit line contact mask 108 as shown in FIG. 1. A conductive film 222 for a bit line is formed on the second interlayer insulation film 220 to contact the exposed second contact plug 218b. A second hard mask film 224 is formed on the conductive film 222 for the bit line.

Referring to FIG. 2C, the second hard mask film 224, the conductive film 222 for the bit line and the second interlayer insulation film 220 are sequentially etched according to an etching process using the bit line mask 110 as shown in FIG. 1, thereby forming a bit line 222a and a contact hole exposing the first contact plug 218a on the source region 210 at the same time. A second etch barrier film 226 is formed over the resultant structure. A third interlayer insulation film 228 is evenly formed on the second etch barrier film 226. A third etch barrier film 230 is formed on the third interlayer insulation film 228.

Referring to FIG. 2D, a sacrificed oxide film 234 is formed on the third etch barrier film 230. The sacrificed oxide film 234, the third etch barrier film 230, the third interlayer insulation film 228 and the second etch barrier film 226 are etched according to an etching process using the storage electrode contact mask 112 as shown in FIG. 1, thereby forming a storage electrode contact exposing the first contact plug 218a on the source region 210. A conductive film 236 for a storage electrode is formed to fill up a part of the storage electrode contact.

Thereafter, the memory cell including the capacitor having a stacked structure of a storage electrode, dielectric film and plate electrode is formed according to generally-known succeeding processes.

However, in the conventional method for fabricating the semiconductor memory device, the storage electrode contact is self-aligned with the gate electrode and the bit line, but not with the second contact plug on the source region.

Therefore, when the etching process using the storage electrode contact mask as shown in FIG. 1 is carried out in order to form the storage electrode contact, a process defect may be generated due to the misalignment of the mask. In addition, the storage electrode and the contact plug do not completely contact each other, thereby reducing the capacitance of the capacitor.

SUMMARY OF THE INVENTION

Accordingly, an object of the present invention is to provide a method for fabricating a semiconductor memory device which can form a storage electrode contact and a contact plug in a self aligned method.

In order to achieve the above-described object of the present invention, a method for fabricating a semiconductor memory device includes the steps of: providing a semiconductor substrate where a transistor consisting of a gate electrode and source and drain regions has been formed, a first contact plug and a second contact plug being respectively formed on the source and drain regions; forming a bit line electrically connected to the second contact plug on the drain region, and simultaneously forming a contact hole exposing the first contact plug on the source region over the resultant structure; forming an etch barrier film having a uniform thickness at the inner walls of the contact hole and on the bit line; forming an interlayer insulation film on the etch barrier film; forming a storage electrode contact, by etching the interlayer insulation film and the etch barrier film on the first contact plug; forming a third contact plug electrically connected to the first contact plug in the storage electrode contact; and forming on the third contact plug a capacitor having a stacked structure of a storage electrode electrically connected to the third contact plug, and a dielectric film and a plate electrode surrounding the storage electrode.

There is also provided a method for fabricating a semiconductor memory device including the steps of: forming a gate electrode on a semiconductor substrate; forming source and drain regions on the semiconductor substrate at both sides of the gate electrode; forming a first etch barrier film having a uniform thickness over the resultant structure; forming a first interlayer insulation film on the first etch barrier film; forming a first contact hole exposing the source and drain regions, by etching the first interlayer insulation film and the first etch barrier film; forming a first contact plug on the source region and a second contact plug on the drain region, by filling up a conductive film in the first contact hole; forming a second interlayer insulation film exposing the second contact plug on the first and second contact plugs and the first interlayer insulation film; sequentially forming a conductive film for a bit line and a second hard mask film on the exposed second contact plug and the second interlayer insulation film; forming a bit line contacting the second contact plug and a second contact hole exposing the first contact plug, by patterning the second hard mask film and the conductive film for the bit line; forming a second etch barrier film at the inner walls of the contact hole and on the second hard mask film; forming a third interlayer insulation film on the second etch barrier film to completely fill up the second contact hole; forming on the third interlayer insulation film a third etch barrier film exposing the third interlayer insulation film region on the first contact plug; forming a third contact hole exposing the first contact plug, by etching the exposed third interlayer insulation film region and the second etch barrier film on the first contact plug; forming a third contact plug electrically connected to the first contact plug, by filling up a conductive film in the third contact hole; forming a sacrificed oxide film on the third etch barrier film and the third contact plug; forming a fourth contact hole exposing the third contact plug, by etching a predetermined portion of the sacrificed oxide film; and forming over the resultant structure a capacitor being electrically connected to the third contact plug, and having a stacked structure of a storage electrode, dielectric film and plate electrode.

In addition, there is provided a method for fabricating a semiconductor memory device including the steps of: forming a gate electrode on a semiconductor substrate; forming source and drain regions on the semiconductor substrate at both sides of the gate electrode; forming a first etch barrier film having a uniform thickness over the resultant structure; forming a first interlayer insulation film on the first etch barrier film; forming a first contact hole exposing the source and drain regions, by etching the first interlayer insulation film and the first etch barrier film; forming a first contact plug on the source region and a second contact plug on the drain region, by filling up a conductive film in the first contact hole; forming a second interlayer insulation film exposing the second contact plug on the first and second contact plugs and the first interlayer insulation film; sequentially forming a conductive film for a bit line and a second hard mask film on the exposed second contact plug and the second interlayer insulation film; forming a bit line contacting the second contact plug and a second contact hole exposing the first contact plug, by patterning the second hard mask film and the conductive film for the bit line; forming a second etch barrier fiilm at the inner walls of the contact hole and on the second hard mask film; forming a third interlayer insulation film on the second etch barrier film to completely fill up the second contact hole; forming on the third interlayer insulation film a third etch barrier film exposing the third interlayer insulation film region on the first contact plug; forming a sacrificed oxide film on the third etch barrier film; forming a storage electrode contact, by etching the sacrificed oxide film, the third interlayer insulation film and the second etch barrier film on the first contact plug; forming a third contact plug electrically connected to the first contact plug at the lower portion of the storage electrode contact, by forming a conductive film for a storage electrode at the inner walls of the storage electrode contact and on the sacrificed oxide film; forming a storage electrode, by removing the conductive film for the storage electrode on the sacrificed oxide film and the sacrificed oxide film; and sequentially forming a dielectric film and a plate electrode on the storage electrode in order to form a capacitor.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 3:
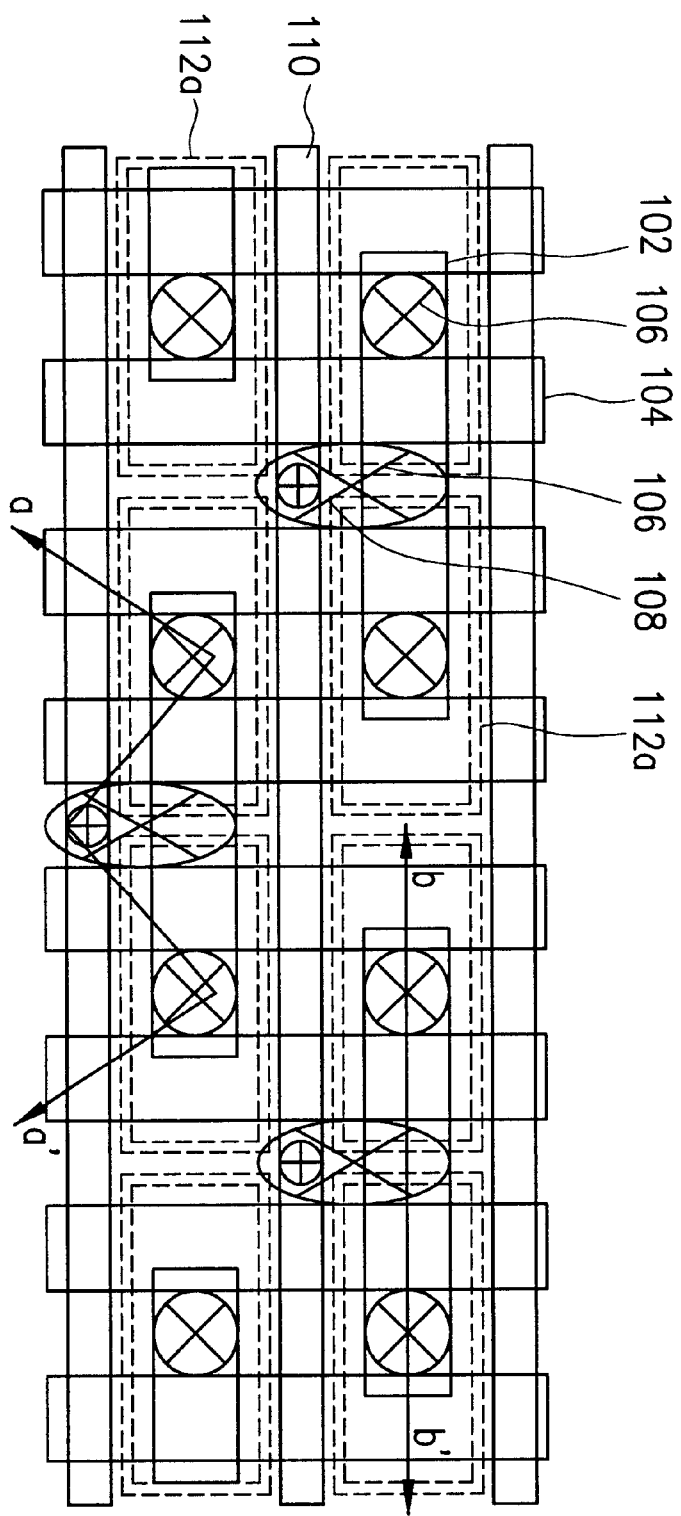
FIG. 3 is a plan view illustrating masks used to form a memory cell of a semiconductor memory device in accordance with the present invention.

FIG. 3 is a plan view illustrating masks used to form a memory cell of a semiconductor memory device in accordance with the present invention. Here, identical elements to FIG. 1 are provided with identical reference numerals.

Figure 1:
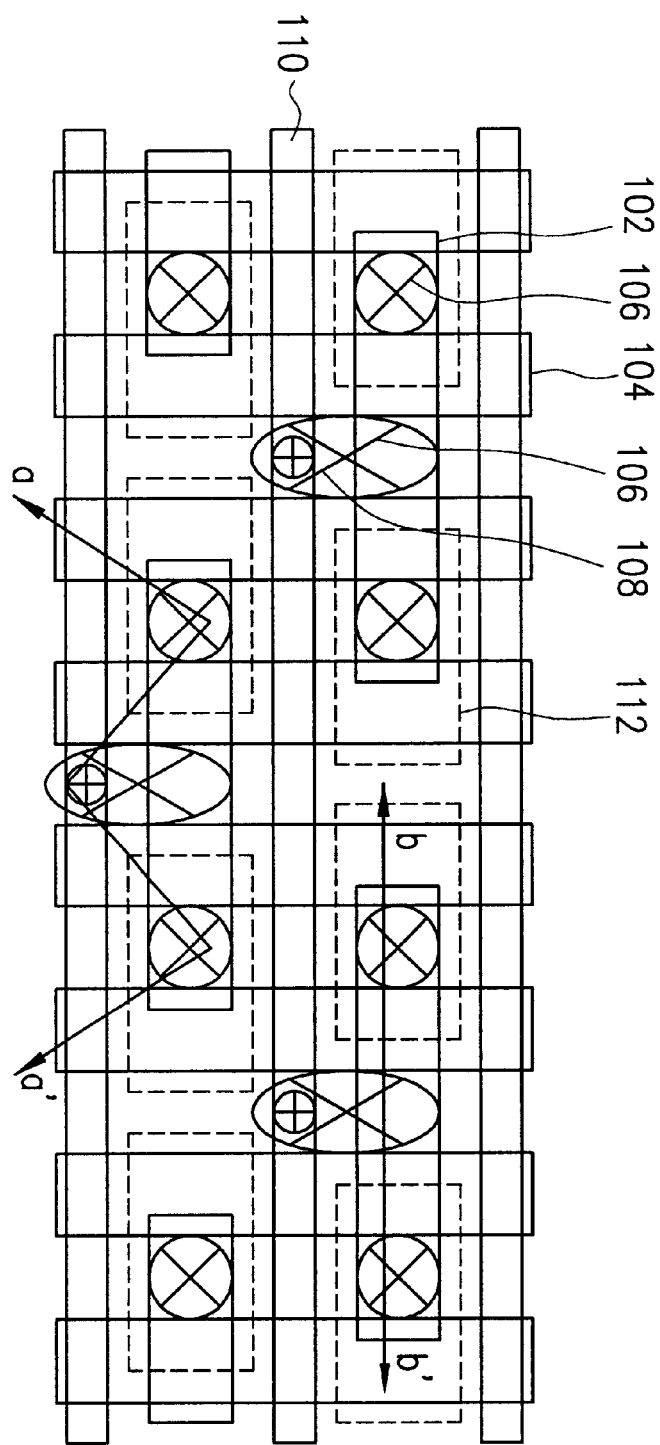
FIG. 1 is a plan view illustrating masks used to form a memory cell of a conventional semiconductor memory device.
Figure 2A:
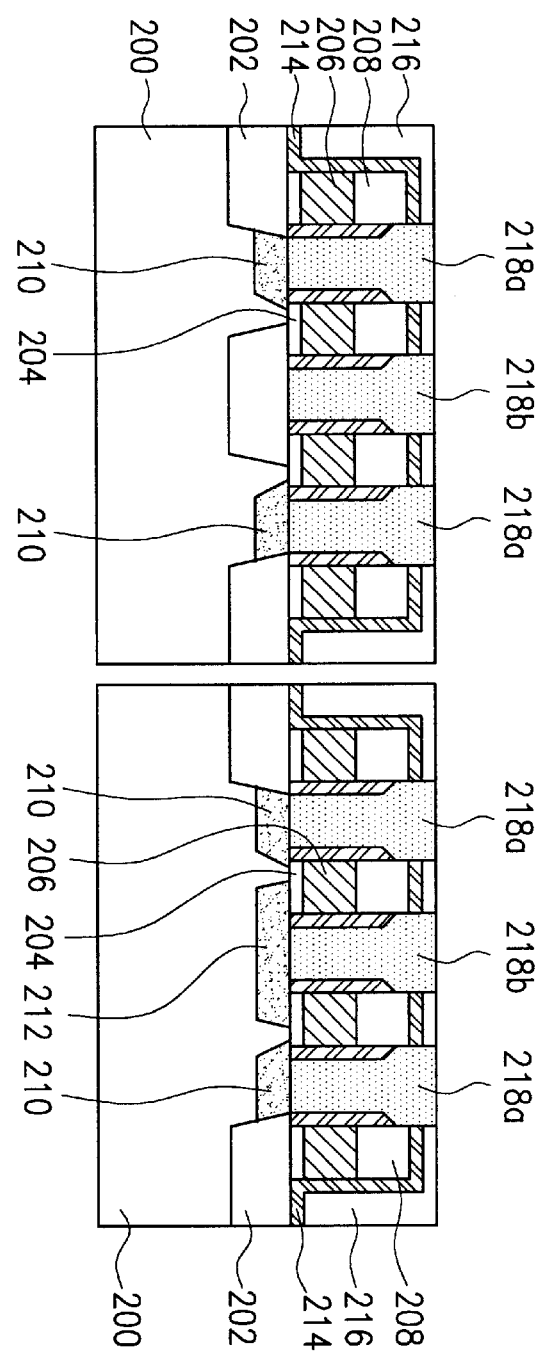
FIGS. 2A to 2D are cross-sectional diagrams illustrating sequential steps of a conventional method for fabricating a semiconductor memory device, taken along lines a-a' and b-b' in FIG. 1.
Figure 2B:
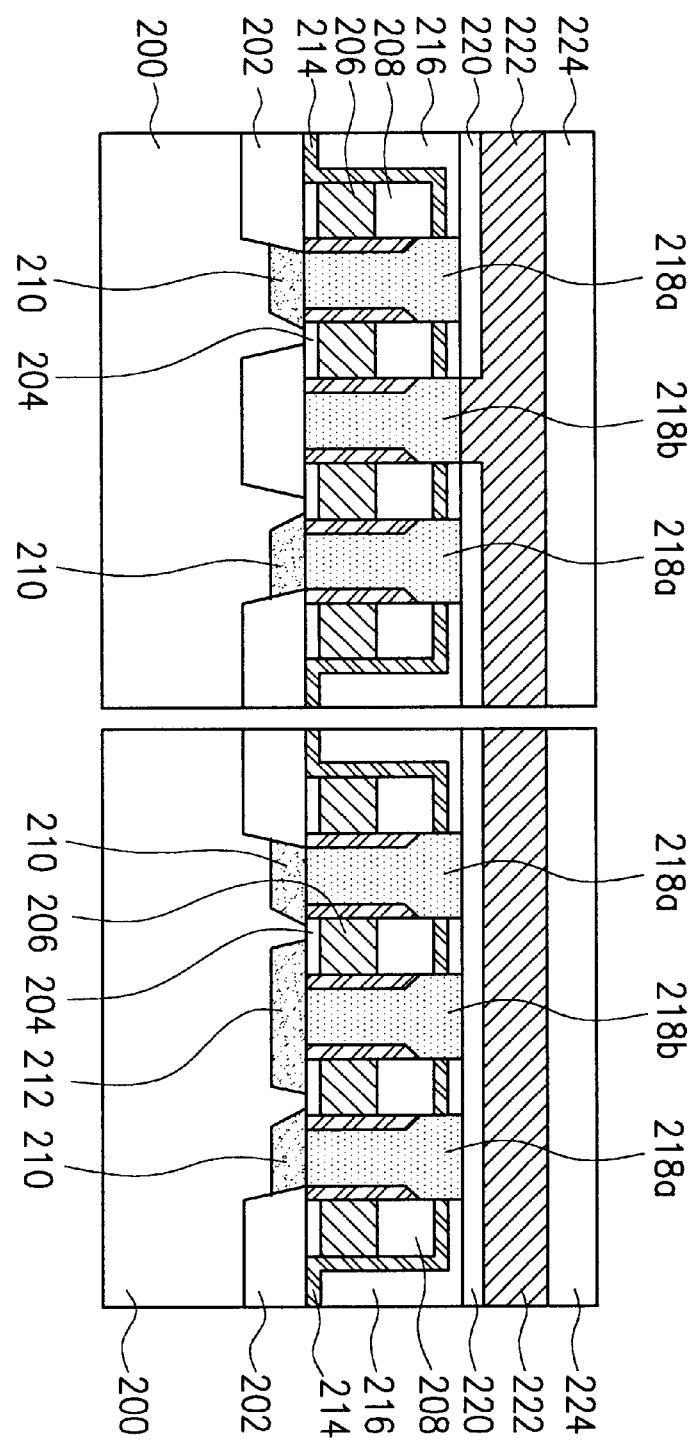
Figure 2C:
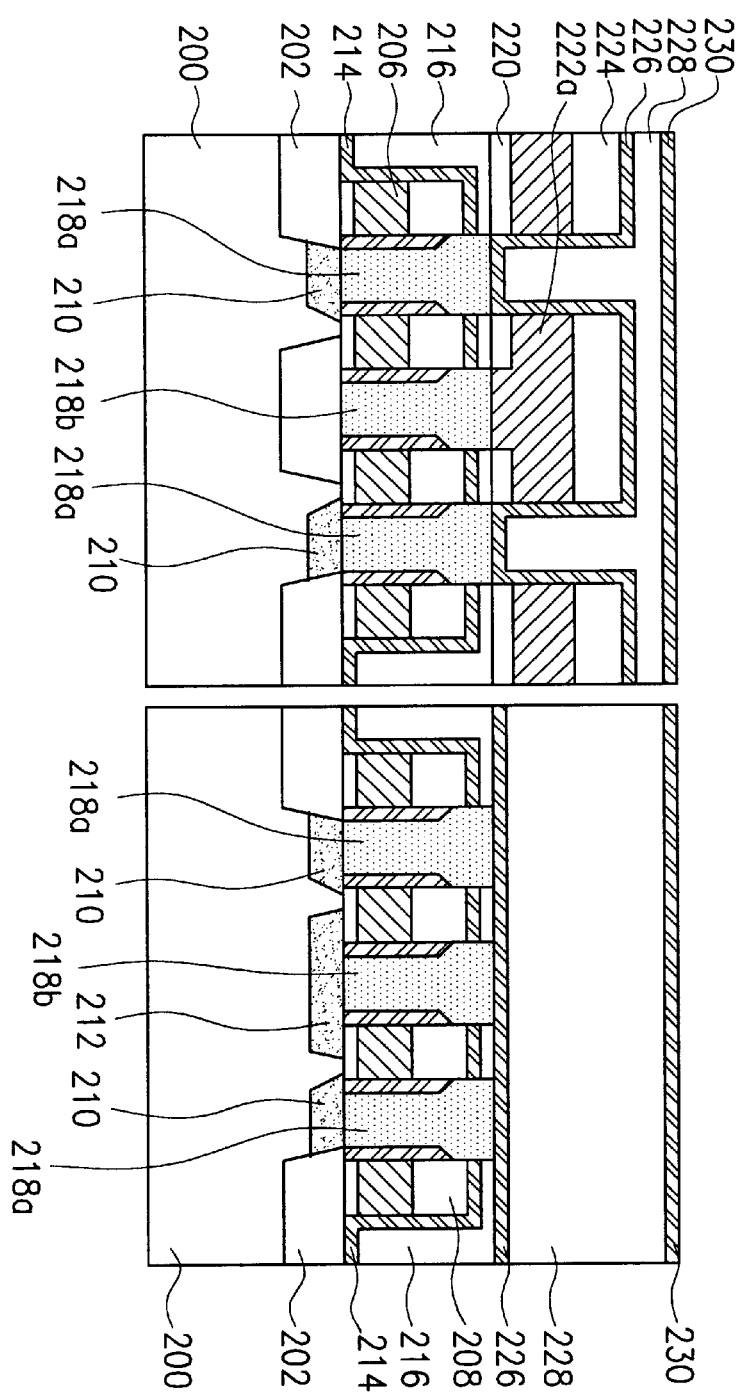
Figure 2D:
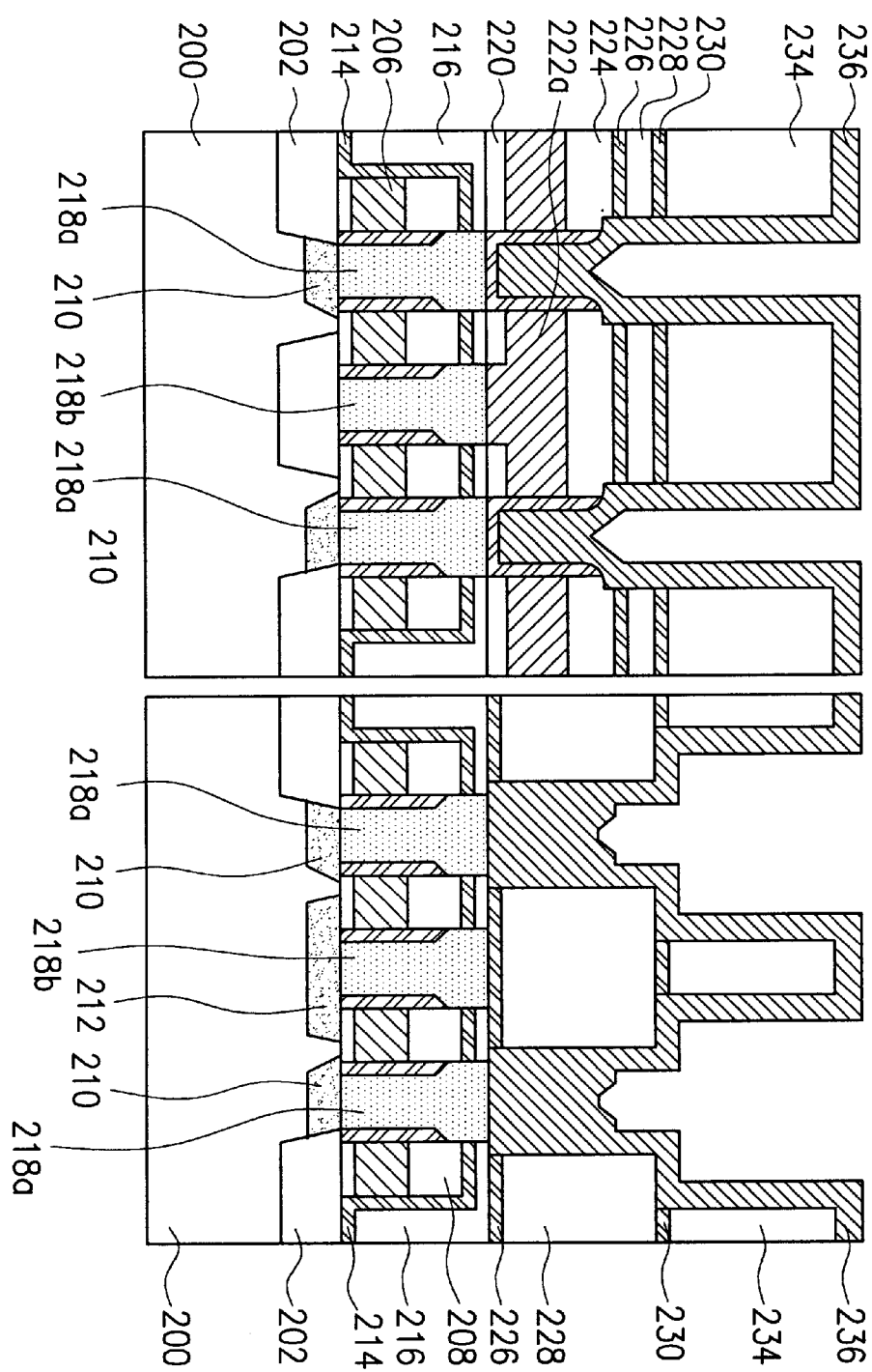

Referring to FIG. 3, an active mask 102, a gate electrode mask 104, a contact plug mask 106, a bit line contact mask 108 and a bit line mask 110 are identical to those in FIG. 1, but a storage electrode contact mask 112a is self aligned with a contact plug on a source region as well as a gate electrode and a bit line.

A method for fabricating a semiconductor memory device by using the masks as shown in FIG. 3 in accordance with the present invention will now be described with reference to the accompanying drawings.

Embodiment 1

FIGS. 4A to 4G are cross-sectional diagrams illustrating sequential steps of the method for fabricating the semiconductor memory device in accordance with a first embodiment of the present invention. Here, Figures at the left side are cross-sectional diagrams taken along line a-a' in FIG. 3, and Figures at the right side are cross-sectional diagrams taken along line b-b' in FIG. 3.

Figure 4A:
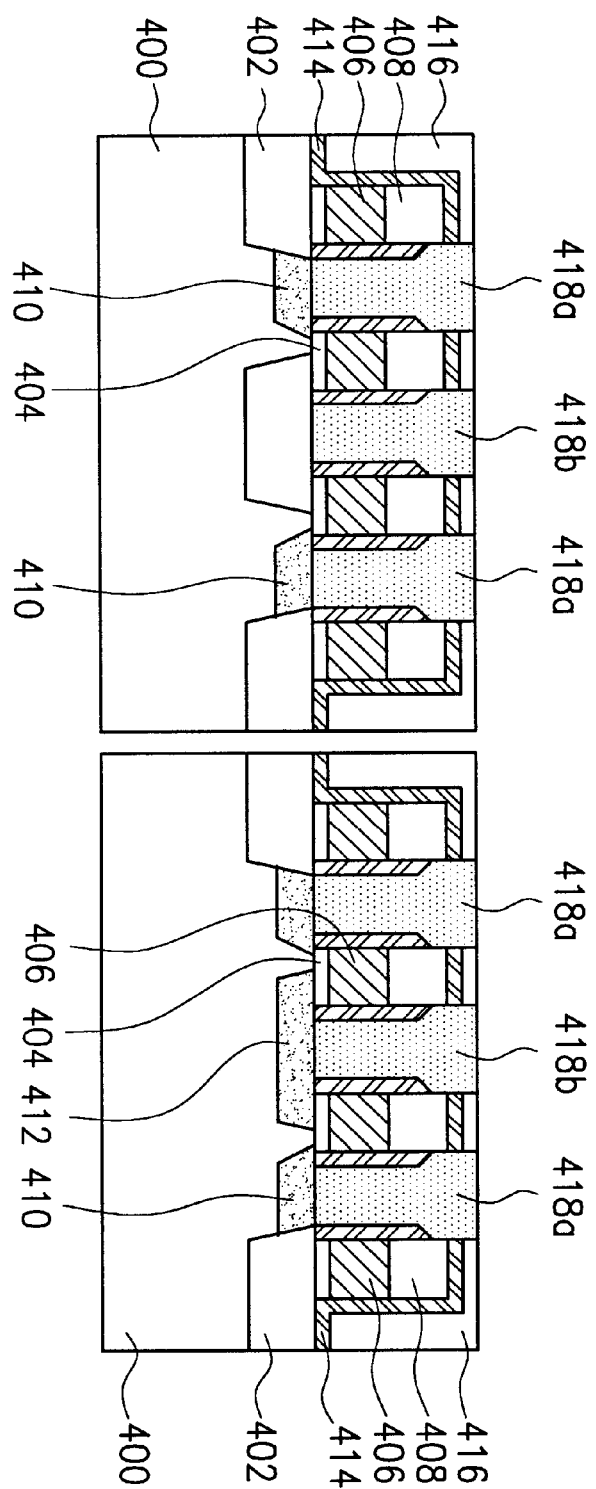
FIGS. 4A to 4G are cross-sectional diagrams illustrating sequential steps of a method for fabricating a semiconductor memory device in accordance with a first embodiment of the present invention, taken along lines a-a' and b-b' in FIG. 3.
Figure 4B:
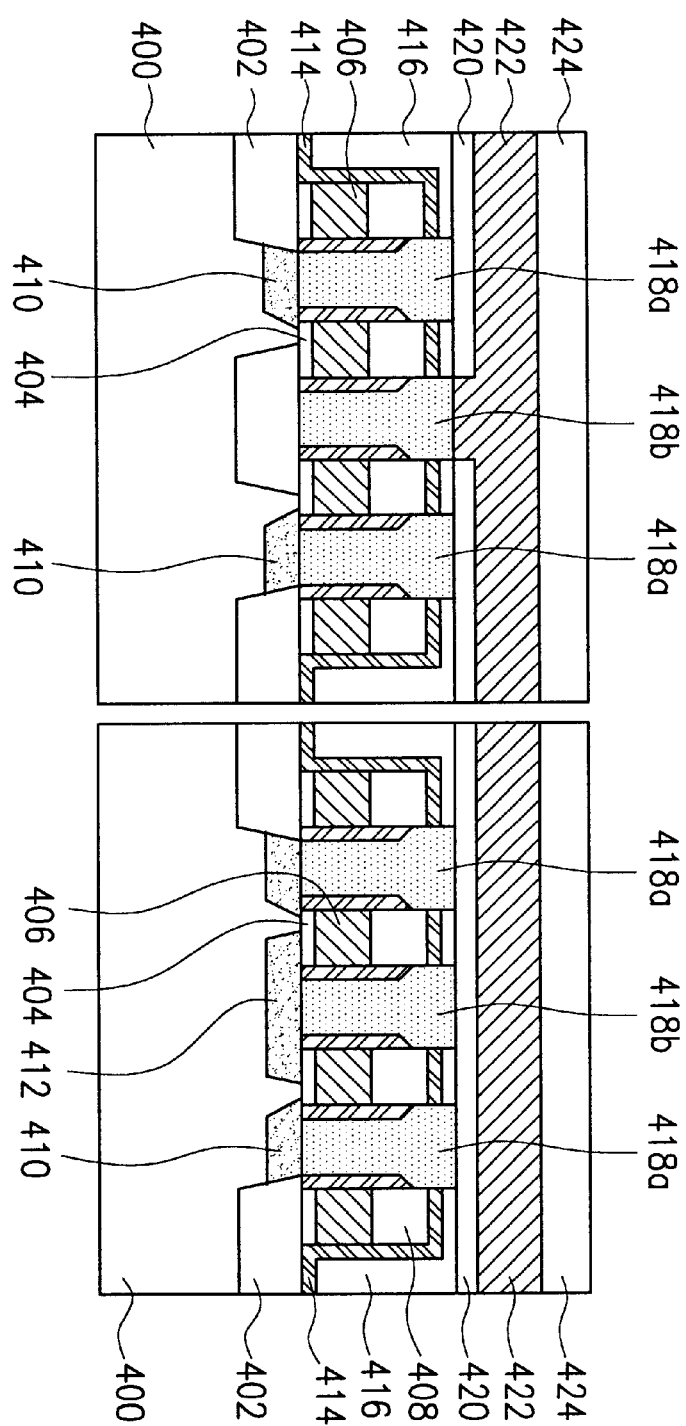

Referring to FIG. 4A, a device isolation film 402 is formed at a predetermined portion of a semiconductor substrate 400. A gate insulation film 404, a conductive film for a gate electrode and a first hard mask film 408 are sequentially formed on the semiconductor substrate 400. The first hard mask film 208 consists of an oxide film or nitride film. The first hard mask film 408, the conductive film for the gate electrode and the gate insulation film 404 are patterned according to an etching process using the gate electrode mask 104 as shown in FIG. 3, thereby forming a gate electrode 406. Source/drain regions 410, 412 are formed on the semiconductor substrate 400 at both sides of the gate electrode 406 according to an impurity ion implantation process, thereby forming a transistor.

A first etch barrier film 414 is formed over the resultant structure. The first etch barrier film 414 consists of an oxide film or nitride film, preferably the nitride film. A first interlayer insulation film 416 is sufficiently deposited on the first etch barrier film 414 to cover the resultant structure. Thereafter, the surface of the first interlayer insulation film 416 is planarized according to a chemical mechanical polishing (CMP) process. The first interlayer insulation film 416 is etched by using the contact plug mask 106 as shown in FIG. 3 and the first etch barrier film 414 as an etch barrier. A contact hole exposing the source region 410 contacting a capacitor and the drain region 412 contacting a bit line is formed by etching the first etch barrier film on the source and drain regions 410, 412. A conductive film is formed to fill up the contact hole. Thereafter, the conductive film is etched back to expose the first interlayer insulation film 416, thereby forming a first contact plug 418a and a second contact plug 418b.

Referring to 4B, a second interlayer insulation film 420 is formed on the first interlayer insulation film 416 and the first and second contact plugs 418a, 418b. The second interlayer insulation film 420 is etched according to an etching process using the bit line contact mask 108 as shown in FIG. 3, thereby exposing the second contact plug 418b on the drain region 412. A conductive film 422 for a bit line is formed on the second interlayer insulation film 420 to contact the exposed second contact plug 418b. A second hard mask film 424 is formed on the conductive film 422 for the bit line.

Figure 4C:
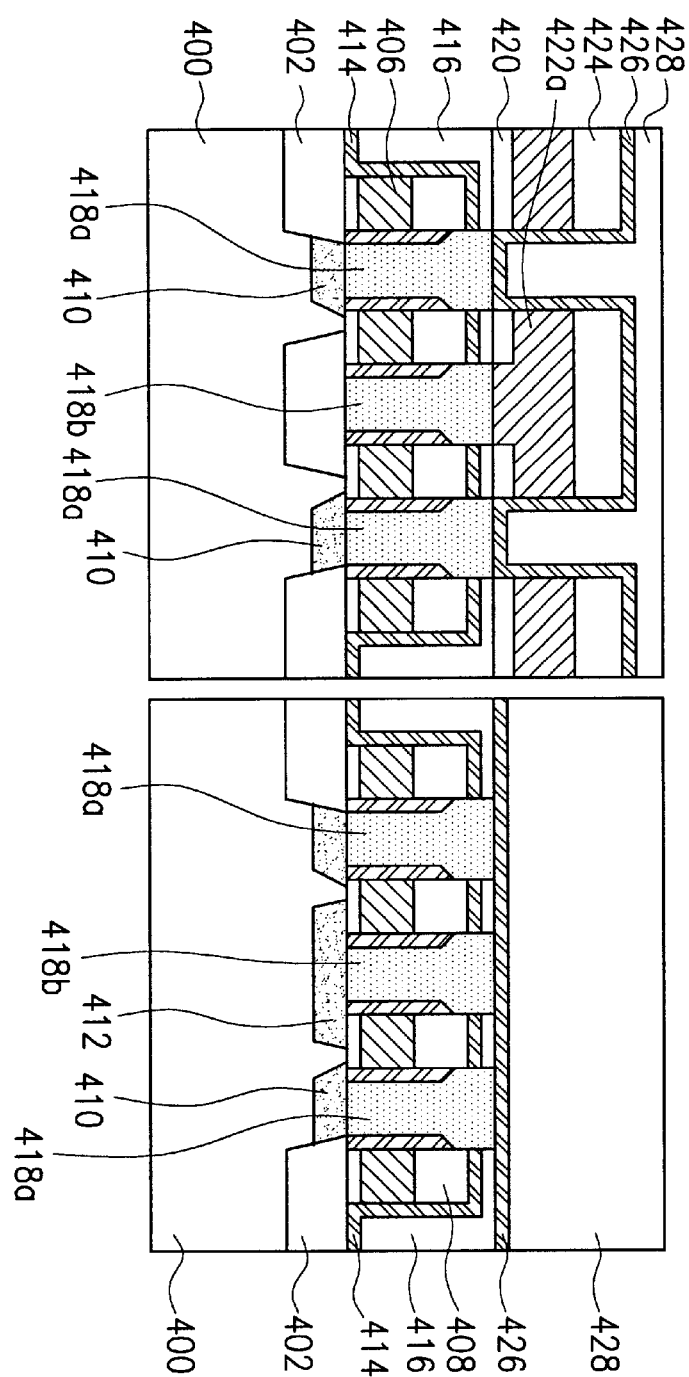

Referring to FIG. 4C, the second hard mask film 424, the conductive film 422 for the bit line and the second interlayer insulation film 420 are etched according to an etching process using the bit line mask 110 as shown in FIG. 3, thereby forming a bit line 422a and exposing the first contact plug 418a on the source region 410 at the same time. Here, the second interlayer insulation film 420 is not completely etched so that it can remain on the first contact plug 418a. A second etch barrier film 426 is formed over the resultant structure. The second etch barrier film 426 consists of an oxide film or nitride film, preferably the nitride film. A third interlayer insulation film 428 is evenly formed on the second etch barrier film 426. Preferably, the third interlayer insulation film 428 is formed in the same manner as the first interlayer insulation film 416.

Figure 4D:
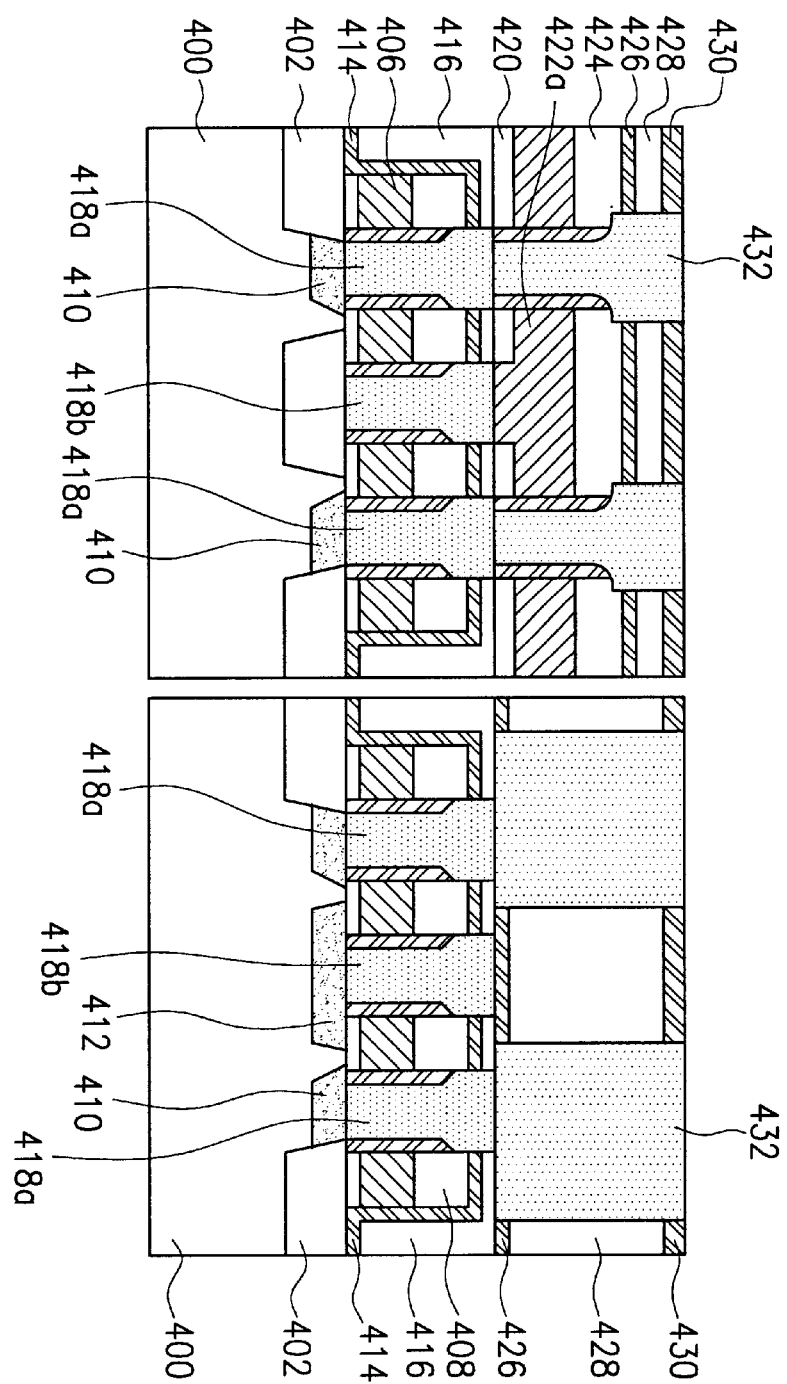

Referring to FIG. 4D, a third etch barrier film 430 is formed on the third interlayer insulation film 428. The third etch barrier film 430 is etched according to an etching process using the storage electrode contact mask 112a as shown in FIG. 3 as an etch barrier. Thereafter, the third interlayer insulation film 428 is etched according to an etching process using the storage electrode contact mask 112a and the second etch barrier film 426 as an etch barrier, and the second etch barrier film 426 on the first contact plug 418a is etched, thereby forming a contact hole exposing the first contact plug 418a on the source region 410. A conductive film is sufficiently deposited on the third etch barrier film 430 to completely fill up the contact hole exposing the first contact plug 418a. The conductive film is etched back to expose the third etch barrier film 430, thereby forming a third contact plug 432 contacting the first contact plug 418a on the source region 410.

Figure 5A:
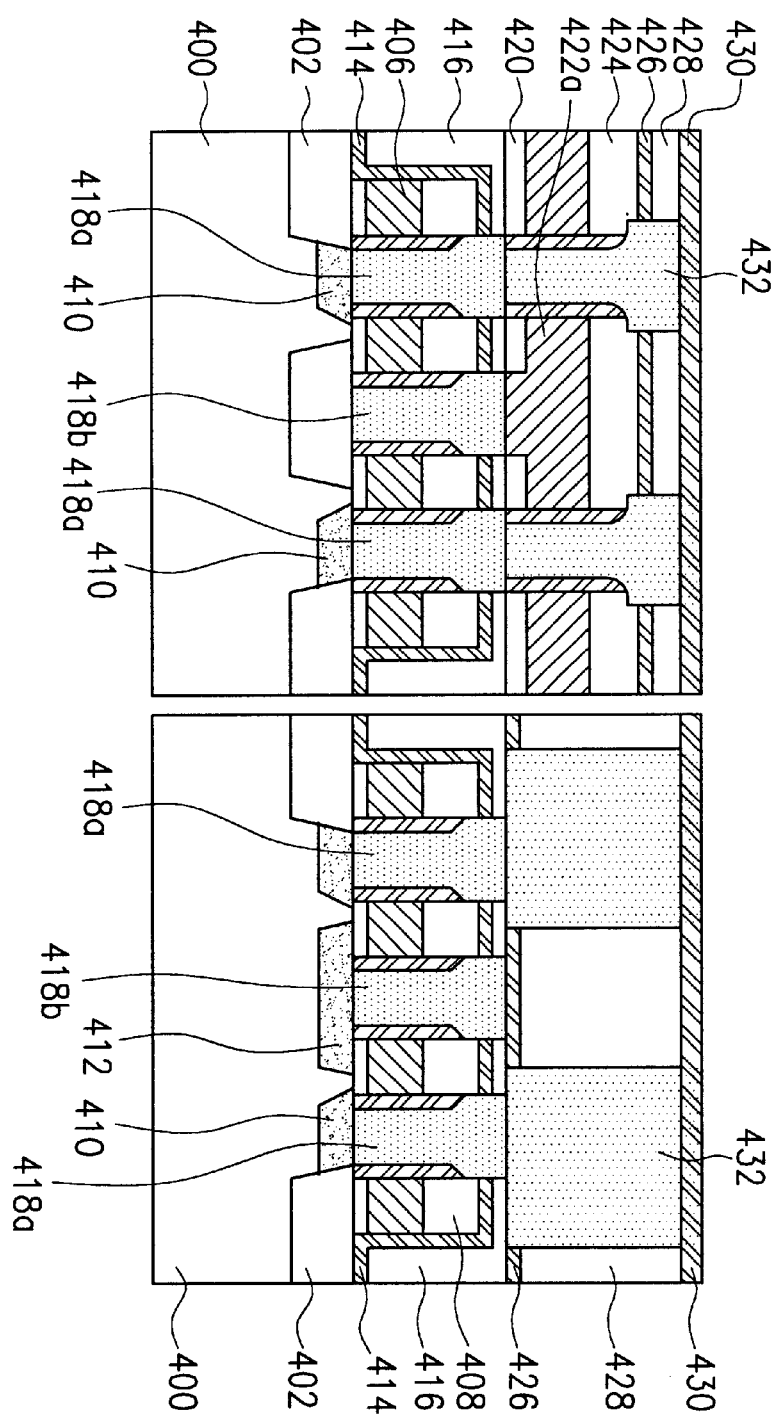
FIGS. 5A to 5C are cross-sectional diagrams illustrating modified steps of the method for fabricating the semiconductor memory device in accordance with the first embodiment of the present invention.

On the other hand, as illustrated in FIG. 5A, the third contact plug 432 may be formed before forming the third etch barrier film 430. Here, the third etch barrier film 430 is formed on the third contact plug 432 and the third interlayer insulation film 428. That is, a formation order of the third contact plug 432 and the third etch barrier film 430 can be changed. In either case, an identical result is obtained.

Figure 4E:
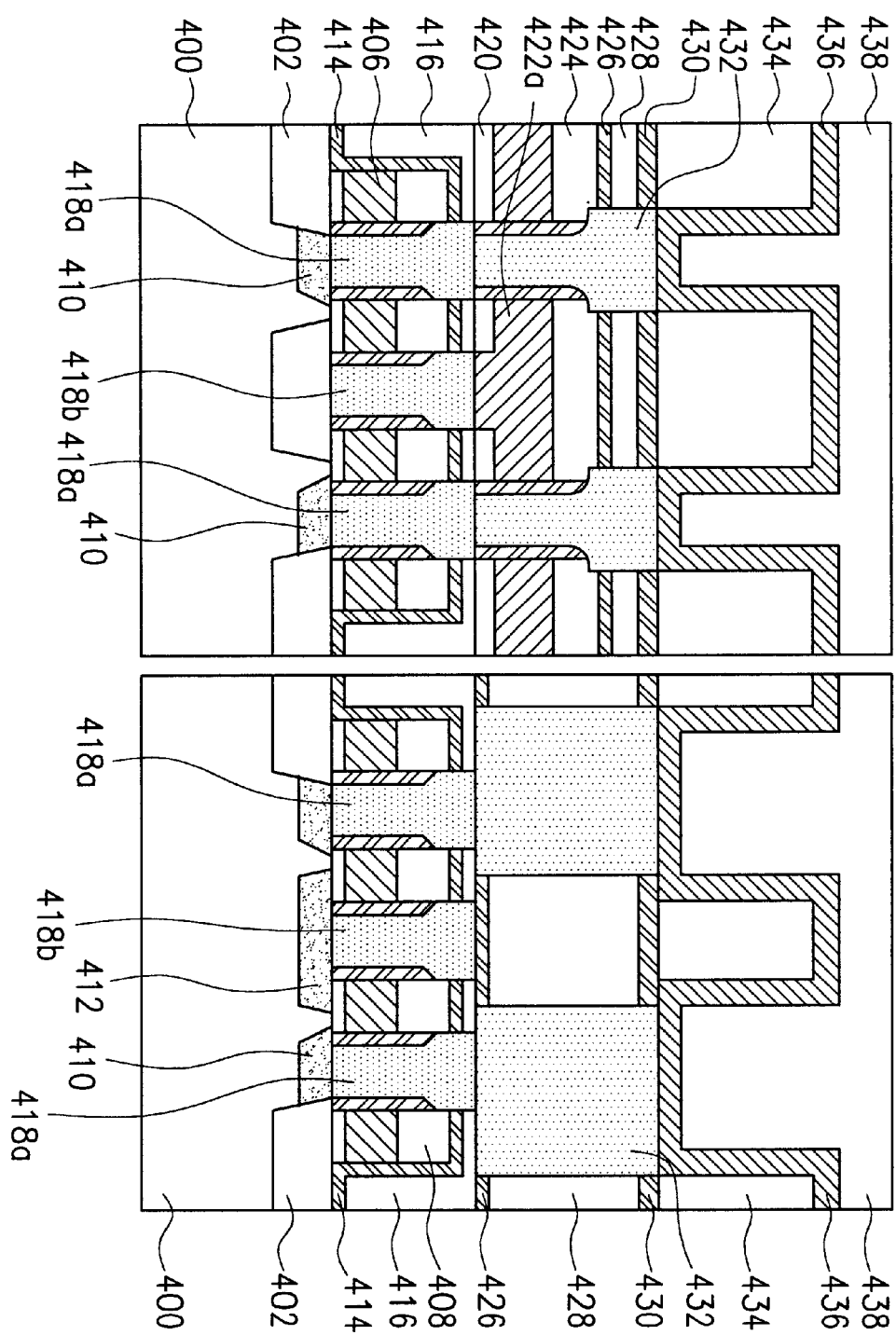

Referring to FIG. 4E, a first sacrificed oxide film 434 is formed on the third etch barrier film 430 and the third contact plug 432. The first sacrificed oxide film 434 is etched according to an etching process using the storage electrode contact mask 112a as shown in FIG. 3, thereby forming a storage electrode contact exposing the third contact plug 432. A conductive film 436 for a storage electrode is deposited on the first sacrificed oxide film 434 and at the inner walls of the storage electrode contact. A second sacrificed oxide film 438 is evenly formed on the conductive film 436 for the storage electrode.

Figure 4F:
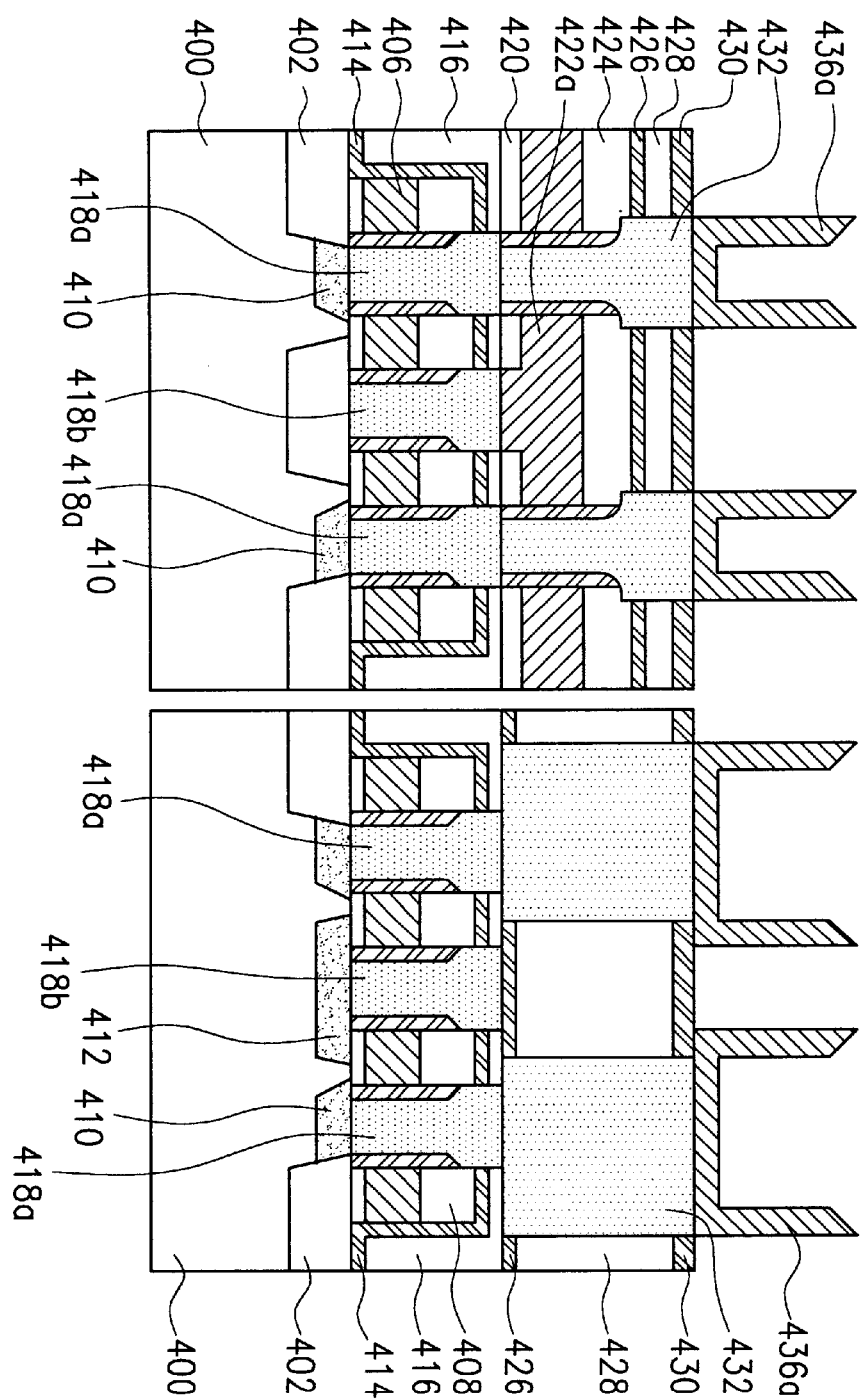

Referring to FIG. 4F, the second sacrificed oxide film 438 is etched back to expose the conductive film for the storage electrode on the first sacrificed oxide film 434. Thereafter, the exposed conductive film for the storage electrode is etched/removed. The first and second sacrificed oxide films are removed according to an etching process using the conductive film for the storage electrode and the third etch barrier film 430 as an etch barrier, thereby forming a cylinder type storage electrode 436a. Here, FIG. 4F illustrates a plan view of the storage electrode 436a at its top right portion.

Figure 5B:
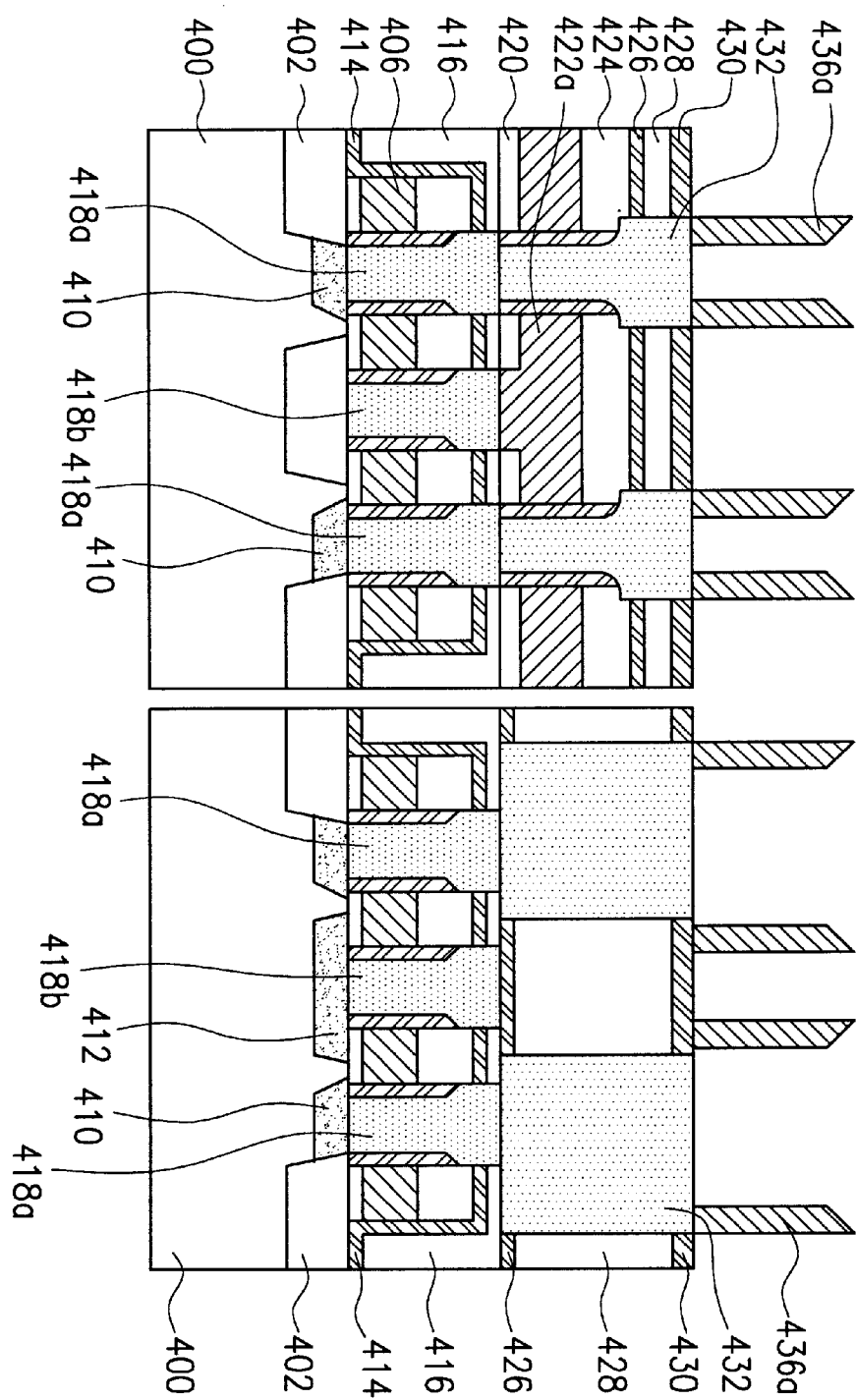

On the other hand, the storage electrode 436a may be formed without forming the second sacrificed oxide film 438. In this case, as shown in FIG. 5B, the conductive film for the storage electrode is etched according to an etch back process on the first sacrificed oxide film 434 and the third contact plug 432.

Figure 4G:
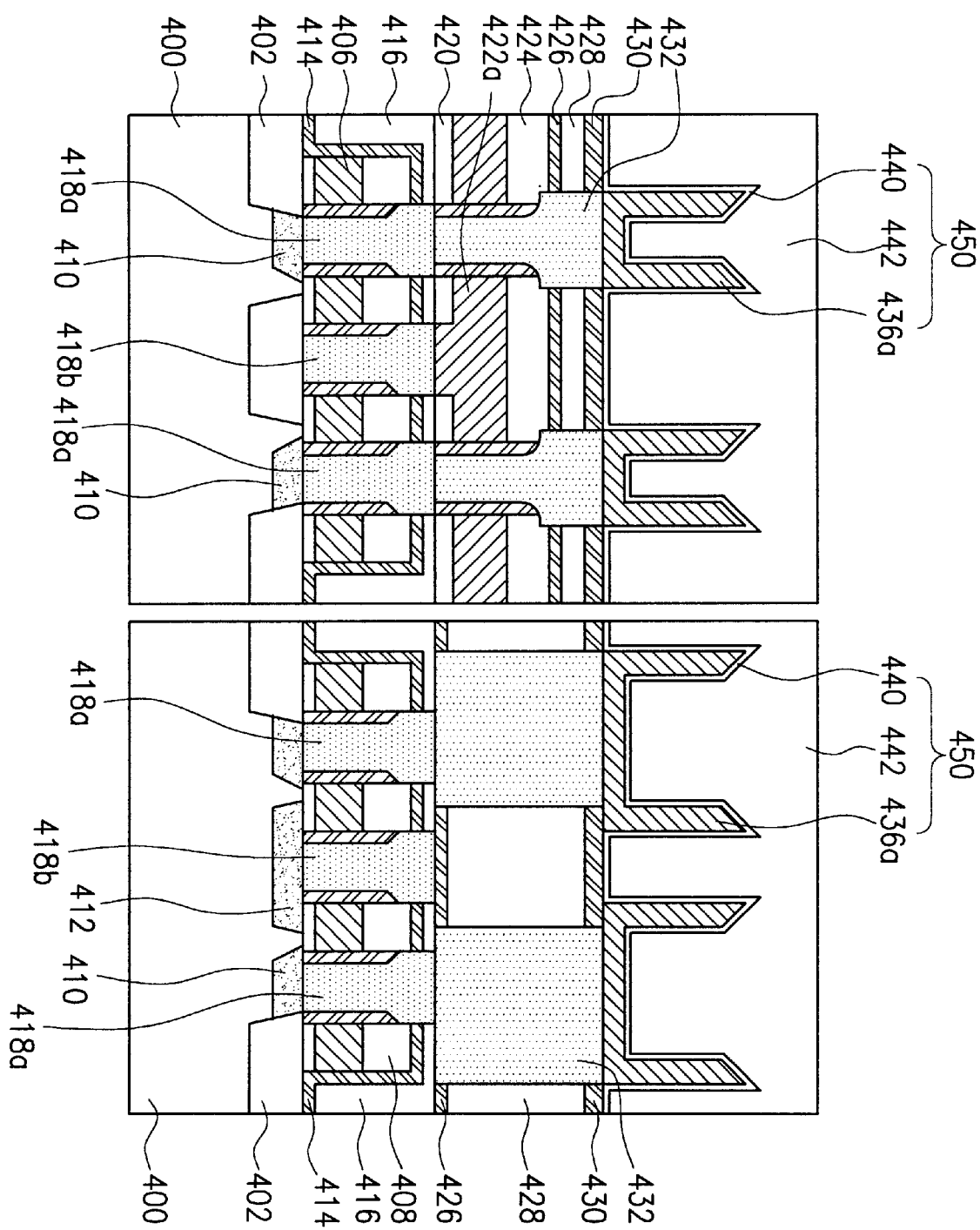

Referring to FIG. 4G, a dielectric film 440 is evenly formed over the resultant structure, and a plate electrode 442 is formed on the dielectric film 440, thereby completing formation of the memory cell of the semiconductor memory device including capacitor 450.

A doped polysilicon film is preferably employed as the conductive film for the storage electrode and the conductive film for the plate electrode. A WN film or TiN film may also be used. When a ferroelectric material is employed as the dielectric film, platinum may be used as the conductive film for the storage electrode and the conductive film for the plate electrode. In addition, in order to increase a surface area, the storage electrode 436a may be formed in a hemispherical grain structure.

Figure 5C:
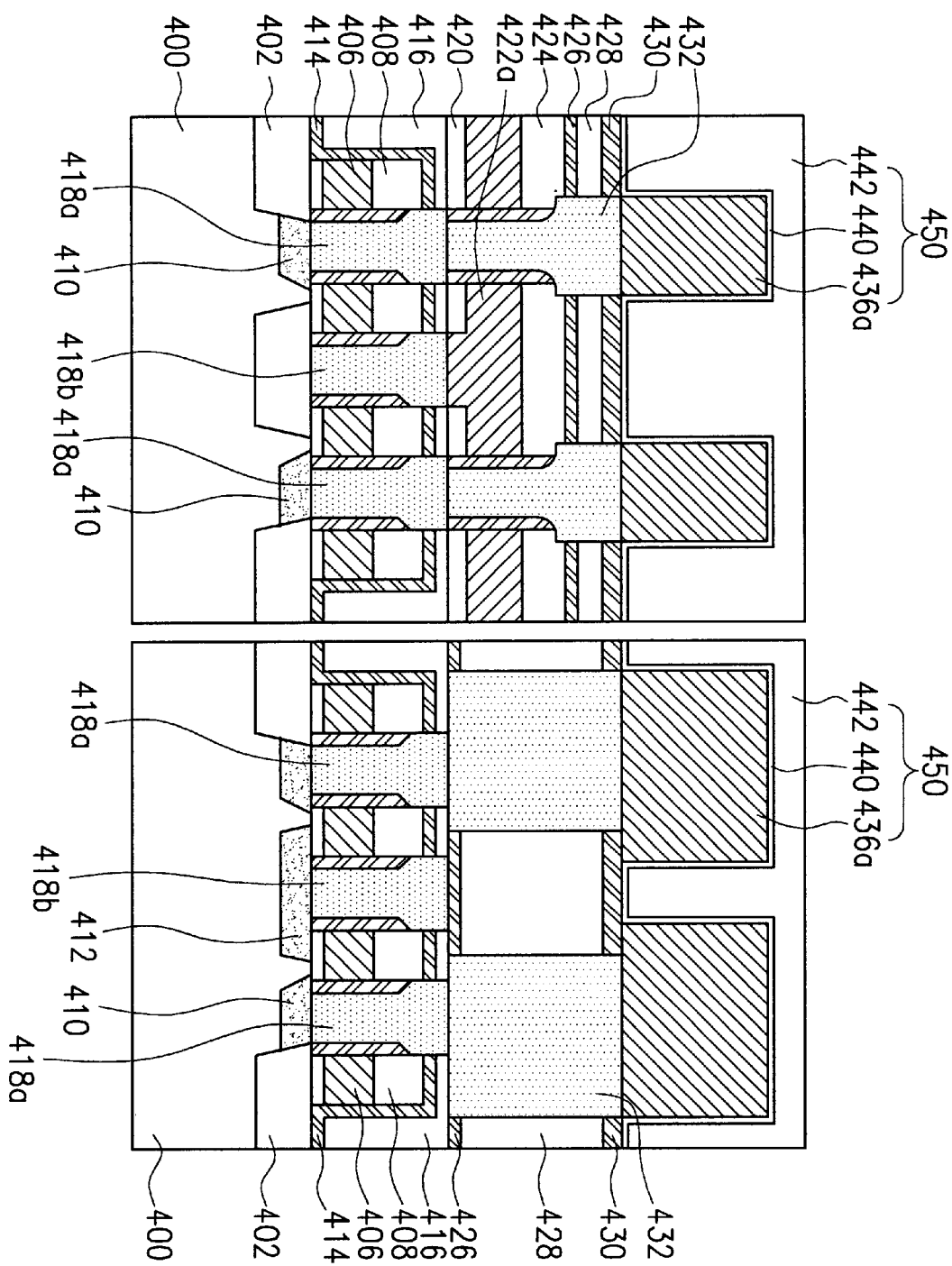

On the other hand, the capacitor 450 may be formed in a stack type, instead of a cylinder type. In this case, as shown in FIG. 5C, the storage electrode 436a has the stack shape, and the dielectric film 440 and the plate electrode 442 surround the storage electrode 436a.

A process for fabricating the capacitor having the stack type will now be described. The conductive film for the storage electrode is sufficiently deposited on the first sacrificed oxide film to fill up the storage electrode contact. Thereafter, the conductive film for the storage electrode is etched back to expose the first sacrificed oxide film. The first sacrificed oxide film is removed, thereby forming the stack type storage electrode. The dielectric film and the plate electrode are sequentially formed on the storage electrode, thereby completing the capacitor having the stack type.

As described above, since the third contact plug 432 is formed on the first contact plug 418, the storage electrode contact is self aligned with the source region 410 including the first and third contact plugs 418, 432 as well as the gate electrode 406 and the bit line 422a. As a result, a process defect is not generated due to the misalignment of the mask, and the area of the storage electrode in a unit cell is maximized, thereby increasing the capacitance of the capacitor.

Embodiment 2

Figure 6A:
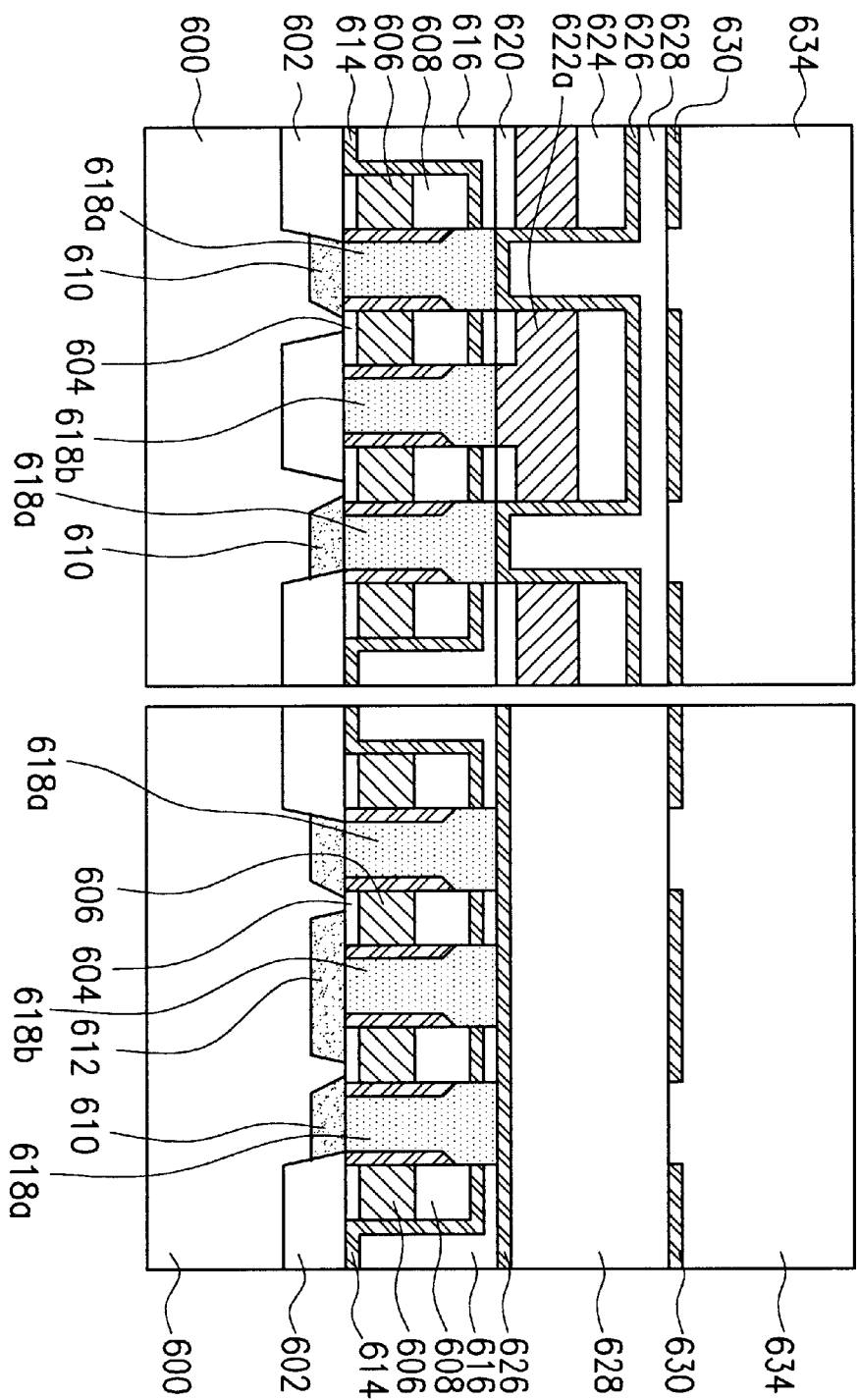
FIGS. 6A to 6C are cross-sectional diagrams illustrating sequential steps of a method for fabricating a semiconductor memory device in accordance with a second embodiment of the present invention, taken along lines a-a' and b-b' in FIG. 3.
Figure 6B:
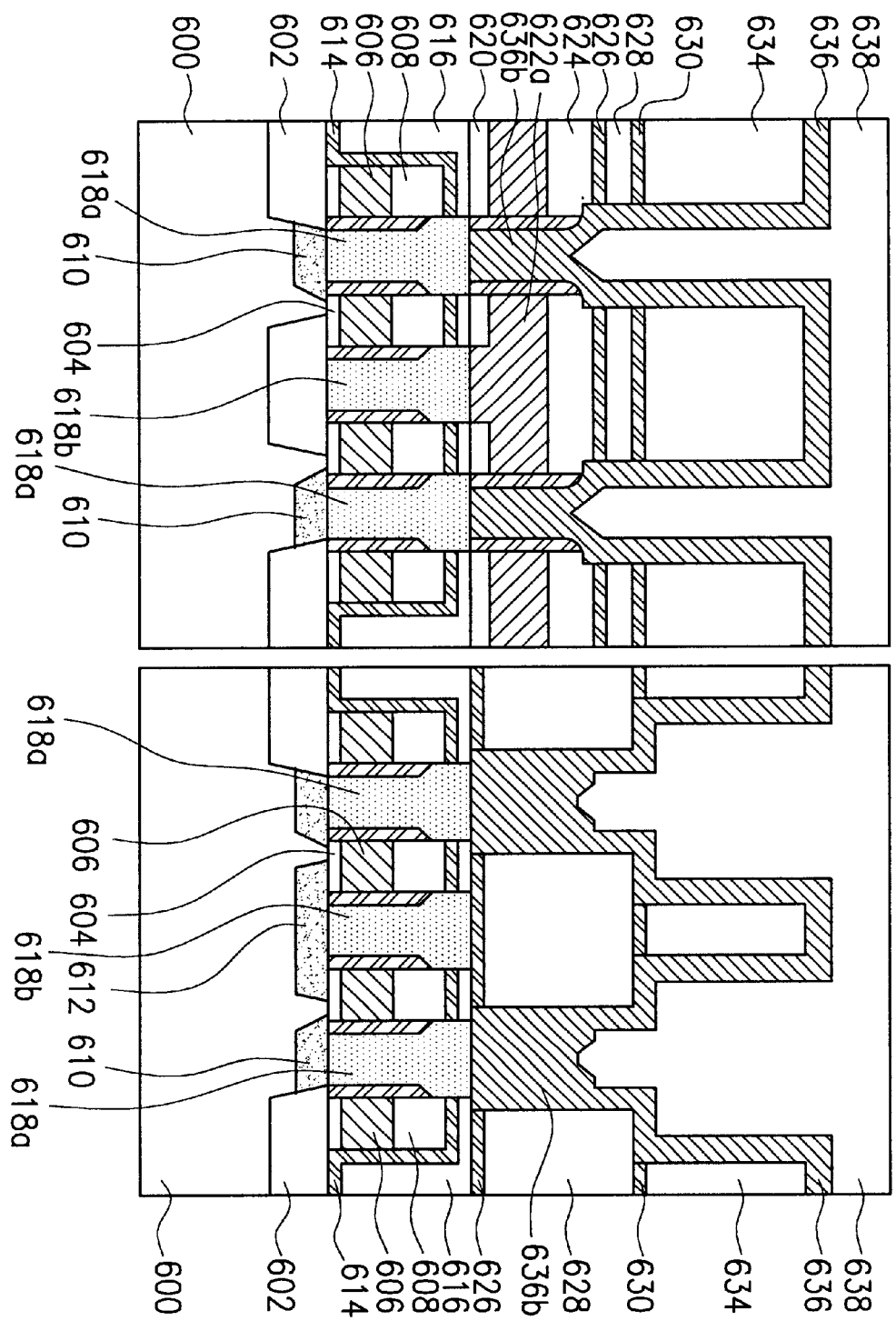
Figure 6C:
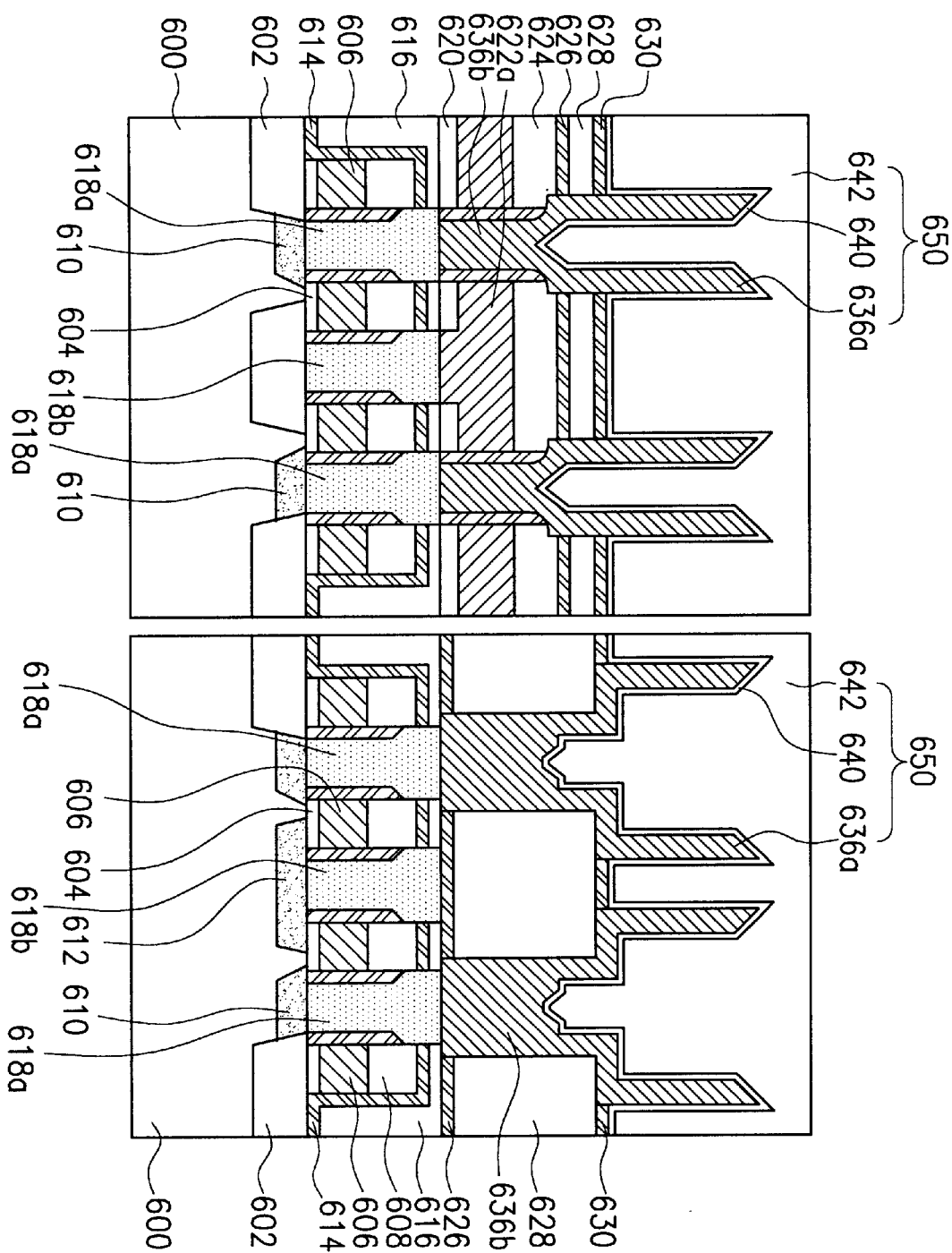

FIGS. 6A to 6C are cross-sectional diagrams illustrating sequential steps of the method for fabricating the semiconductor memory device in accordance with a second embodiment of the present invention. The second embodiment is identically performed to the first embodiment until the step for forming the second etch barrier film. Accordingly, the succeeding process will now be explained. In addition, reference numerals are identical to those in FIGS. 4A to 4G, but their initial numbers start with '6'.

Referring to FIG. 6A, there is provided a semiconductor substrate 600 where a bit line 622a and a contact hole exposing a first contact plug 618a on a source region 610 have been formed. A second etch barrier film 626 is formed at the inner walls of the contact hole and on a second hard mask film 624. A third interlayer insulation film 628 is evenly formed on the second etch barrier film 626 to fill up the contact hole. A third etch barrier film 630 is formed on the third interlayer insulation film 628. Thereafter, the third etch barrier film 630 on the first contact plug 618a is removed according to an etching process. A first sacrificed oxide film 634 is formed on the residual third etch barrier film 630 and the exposed third interlayer insulation film 628.

Referring to FIG. 6B, the first sacrificed oxide film 634 and the third interlayer insulation film 628 are etched according to an etching process using as an etch barrier the storage electrode contact mask 112a as shown in FIG. 3, the third etch barrier film 630 and the second etch barrier film 626. The second etch barrier film on the first contact plug 618a is etched to form a storage electrode contact exposing the first contact plug 618a on the source region 610 to be connected to the capacitor. Here, the third etch barrier film 630 is partially etched. A conductive film 636 for a storage electrode is evenly formed over the resultant structure. Here, the lower portion of the storage electrode contact is filled with the conductive film for the storage electrode, thereby forming a third contact plug 636b electrically connected to the first contact plug 618a on the source region 610. A second sacrificed oxide film 638 is evenly formed on the conductive film 636 for the storage electrode to completely fill up the storage electrode contact.

Referring to FIG. 6C, the second sacrificed oxide film 638 is etched according to an etch back process, thereby exposing the conductive film for the storage electrode on the first sacrificed oxide film 634. Thereafter, the exposed conductive film for the storage electrode is etched. The first and second sacrificed oxide films 634, 638 are etched according to an etching process using the third etch barrier film 630 as an etch barrier, thereby forming a cylinder type storage electrode 636a. A dielectric film 640 is evenly formed over the resultant structure, a plate electrode 642 is formed on the dielectric film 640, thereby completing the memory cell of the semiconductor memory device including the cylinder type capacitor 650.

As identical to the first embodiment of the present invention, the storage electrode contact is self-aligned with the contact plug on the source region as well as the gate electrode and the bit line. Therefore, the second embodiment of the present invention obtains a substantially identical result to the first embodiment thereof.

On the other hand, in the second embodiment, the capacitor may have a stack type, instead of a cylinder type. It is recognized that a method for fabricating the capacitor having the stack type can be easily developed by those skilled in this field with reference to FIG. 5C. Accordingly, the drawings and explanations thereof will be omitted.

As described above, in accordance with the present invention, the storage electrode contact is self-aligned with the contact plug on the source region as well as the gate electrode and the bit line. Thus, a process defect is not generated due to the misalignment in the mask process, thereby increasing a yield. In addition, the occupied area of the storage electrode in the unit cell is maximized, thereby improving the capacitance of the capacitor. As a result, the memory device with high capacity can be embodied.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor memory device, comprising the steps of:

providing a semiconductor substrate where a transistor consisting of a gate electrode and source and drain regions has been formed, a first contact plug and a second contact plug being respectively formed on the source and drain regions;

forming a bit line electrically connected to the second contact plug on the drain region, and simultaneously forming a contact hole exposing the first contact plug on the source region over the resultant structure;

forming an etch barrier film having a uniform thickness at the inner walls of the contact hole and on the bit line;

forming an interlayer insulation film on the etch barrier film;

forming a storage electrode contact, by etching the interlayer insulation film and the etch barrier film on the first contact plug;

forming a third contact plug electrically connected to the first contact plug in the storage electrode contact; and forming on the third contact plug a capacitor having a stacked structure of a storage electrode electrically connected to the third contact plug, and a dielectric film and a plate electrode surrounding the storage electrode.

2. The method according to claim 1, wherein the step for forming the third contact plug comprises the steps of:

forming a conductive film on the interlayer insulation film to completely fill up the storage electrode contact; and etching back the surface of the conductive film.

3. The method according to claim 1, wherein the storage electrode is self aligned with the third contact plug, the bit line and the gate electrode.

4. The method according to claim 1, wherein the storage electrode is formed in a cylindrical shape, or has a stacked structure.

5. A method for fabricating a semiconductor memory device, comprising the steps of:

forming a gate electrode on a semiconductor substrate;

forming source and drain regions on the semiconductor substrate at both sides of the gate electrode;

forming a first etch barrier film having a uniform thickness over the resultant structure;

forming a first interlayer insulation film on the first etch barrier film;

forming a first contact hole exposing the source and drain regions, by etching the first interlayer insulation film and the first etch barrier film;

forming a first contact plug on the source region and a second contact plug on the drain region, by filling up a conductive film in the first contact hole;

forming a second interlayer insulation film exposing the second contact plug on the first and second contact plugs and the first interlayer insulation film;

sequentially forming a conductive film for a bit line and a second hard mask film on the exposed second contact plug and the second interlayer insulation film;

forming a bit line contacting the second contact plug and a second contact hole exposing the first contact plug, by patterning the second hard mask film and the conductive film for the bit line;

forming a second etch barrier film at the inner walls of the contact hole and on the second hard mask film;

forming a third interlayer insulation film on the second etch barrier film to completely fill up the second contact hole;

forming on the third interlayer insulation film a third etch barrier film exposing the third interlayer insulation film region on the first contact plug;

forming a third contact hole exposing the first contact plug, by etching the exposed third interlayer insulation film region and the second etch barrier film on the first contact plug;

forming a third contact plug electrically connected to the first contact plug, by filling up a conductive film in the third contact hole;

forming a sacrificed oxide film on the third etch barrier film and the third contact plug;

forming a fourth contact hole exposing the third contact plug, by etching a predetermined portion of the sacrificed oxide film; and forming over the resultant structure a capacitor being electrically connected to the third contact plug, and having a stacked structure of a storage electrode, dielectric film and plate electrode.

6. A method for fabricating a semiconductor memory device, comprising the steps of:

forming a gate electrode on a semiconductor substrate;

forming source and drain regions on the semiconductor substrate at both sides of the gate electrode;

forming a first etch barrier film having a uniform thickness over the resultant structure;

forming a first interlayer insulation film on the first etch barrier film;

forming a first contact hole exposing the source and drain regions, by etching the first interlayer insulation film and the first etch barrier film;

forming a first contact plug on the source region and a second contact plug on the drain region, by filling up a conductive film in the first contact hole;

forming a second interlayer insulation film exposing the second contact plug on the first and second contact plugs and the first interlayer insulation film;

sequentially forming a conductive film for a bit line and a second hard mask film on the exposed second contact plug and the second interlayer insulation film;

forming a bit line contacting the second contact plug and a second contact hole exposing the first contact plug, by patterning the second hard mask film and the conductive film for the bit line;

forming a second etch barrier film at the inner walls of the contact hole and on the second hard mask film;

forming a third interlayer insulation film on the second etch barrier film to completely fill up the second contact hole;

forming on the third interlayer insulation film a third etch barrier film exposing the third interlayer insulation film region on the first contact plug;

forming a sacrificed oxide film on the third etch barrier film;

forming a storage electrode contact, by etching the sacrificed oxide film, the third interlayer insulation film and the second etch barrier film on the first contact plug;

forming a third contact plug electrically connected to the first contact plug at the lower portion of the storage electrode contact, by forming a conductive film for a storage electrode at the inner walls of the storage electrode contact and on the sacrificed oxide film;

forming a storage electrode, by removing the conductive film for the storage electrode on the sacrificed oxide film and the sacrificed oxide film; and sequentially forming a dielectric film and a plate electrode on the storage electrode in order to form a capacitor.

* * * * *